United States Patent
Morales et al.

(10) Patent No.: US 8,639,459 B1
(45) Date of Patent: Jan. 28, 2014

(54) SYSTEM AND METHOD FOR MONITORING POWER DISTRIBUTION UNITS

(75) Inventors: Osvaldo P. Morales, Seattle, WA (US); Michael P. Czamara, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 357 days.

(21) Appl. No.: 13/076,198

(22) Filed: Mar. 30, 2011

(51) Int. Cl.
*G06F 19/00* (2011.01)
*G01R 21/00* (2006.01)

(52) U.S. Cl.
USPC .......................................................... 702/62

(58) Field of Classification Search
USPC .......................................................... 702/62
See application file for complete search history.

(56) References Cited

U.S. PATENT DOCUMENTS

| | | |
|---|---|---|
| 6,714,977 B1 | 3/2004 | Fowler et al. |
| 6,782,833 B2 | 8/2004 | Nightall |
| 8,321,163 B2 | 11/2012 | Ewing et al. |
| 2005/0068716 A1* | 3/2005 | Pereira ........................... 361/624 |
| 2008/0093927 A1 | 4/2008 | Ewing et al. |
| 2009/0234512 A1* | 9/2009 | Ewing et al. .................. 700/295 |

OTHER PUBLICATIONS

"Two-Channel Intercom Power Supply PS-232" Clear-Com Intercom Systems 2002, pp. 1-2.
Keith Brandt "When Bad Harmonics Happen to Good People" Downloaded May 13, 2011 from news.ospmag.com OSP Magazine published Nov. 2007 pp. 1-3.
U.S. Appl. No. 13/173,102, filed Jun. 30, 2011, Osvaldo P Morales et al.

* cited by examiner

*Primary Examiner* — Bryan Bui
(74) *Attorney, Agent, or Firm* — Robert C. Kowert; Meyertons, Hood, Kivlin, Kowert & Goetzel, P.C.

(57) ABSTRACT

A data center includes one or more racks, one or more electrical systems mounted in at least one of the racks, and one or more rack power distribution units (PDUs) in the racks, and one or more rack PDU power monitors. The rack PDUs distribute electrical power to the electrical systems. Each of the rack PDUs includes one or more PDU coupling devices and a monitoring device. The coupling device couples with PDU output receptacles of the rack PDUs. The monitoring device monitors electrical power output from the PDU output receptacles.

29 Claims, 7 Drawing Sheets

SYSTEM AND METHOD FOR MONITORING POWER DISTRIBUTION UNITS

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

From time to time, elements in the power chain providing power to electrical systems fail or shut down. For example, if a power distribution unit that provides power to electrical systems is overloaded, an overload protection device in the power distribution unit (for example, a fuse or breaker) may trip, shutting down all of the electrical systems that are receiving power through that line of the power distribution unit.

In many data centers, a system operator's first hint that a power distribution unit has failed or shut down is simply a message that one or more servers (or a rack of servers) are down or that communication from the server has been lost. Based on the "server down" or "rack down" message, the operator may have no immediate way of knowing the reason for the failure. For example, the processor on the server or an I/O component on the server(s) may have failed, the server may have been accidently disconnected, etc. As such, maintenance personnel may need to physically go the server in question and determine the source of the problem. The downtime associated with troubleshooting rack power distribution unit faults and shut downs may result in a significant loss of computing resources. In some critical systems such as hospital equipment and security systems, down-time may result in significant disruption and, in some cases, adversely affect health and safety.

Moreover, in many cases, the ultimate user of computing operations on a server may not even have physical access to the server or to elements in the power chain for the system. For example, customers of computing services conducted at co-location facilities may not have immediate physical access to the computing facility, and therefore must rely on the co-location operator to take corrective action on a power distribution failure or shut down.

Figure 1:
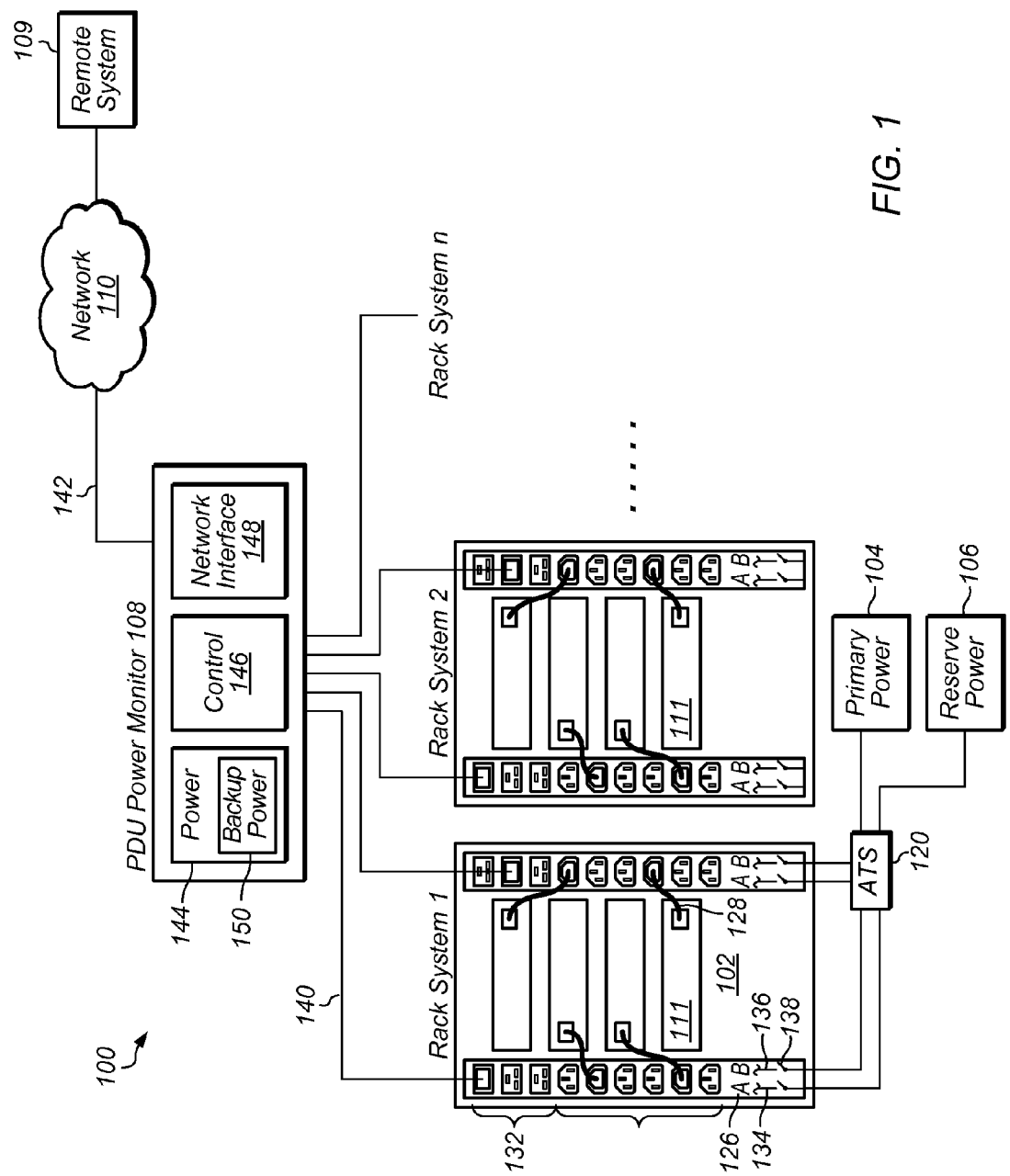
FIG. 1 is a block diagram illustrating one embodiment of a data center including a rack PDU power monitor is connected to rack PDUs in two or more different racks.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of methods and systems for monitoring power to electrical systems, such as computer systems in a data center, are disclosed. According to one embodiment, a data center includes one or more racks, one or more electrical systems mounted in at least one of the racks, and one or more rack power distribution units (PDUs) in the racks, and one or more rack PDU power monitors. The rack PDUs distribute electrical power to the electrical systems. Each of the rack PDUs includes one or more PDU coupling devices and a monitoring device. The coupling device couples with PDU output receptacles of the rack PDUs. The monitoring device monitors electrical power output from the PDU output receptacles.

According to one embodiment, a system for monitoring electrical power from rack power distribution units (PDUs) includes one or more PDU coupling devices that couple with PDU output receptacles of one or more rack PDUs and a monitoring device coupled to the PDU coupling devices. The monitoring device can monitor electrical power output from the PDU output receptacles.

According to one embodiment, a method of monitoring electrical power in a data center includes connecting a monitoring device to rack PDUs. Power is monitored in the rack PDUs. Upon occurrence of a loss of power in one of the rack PDUs, the loss of power in the rack PDU is reported to a system external to the monitor.

According to one embodiment, a method of monitoring computing capacity at a remote computing facility includes remotely monitoring, over a network, electrical power output from one or more rack PDUs supplying electrical power to computing systems being operated at a remote facility. Upon the occurrence of a loss of power in one or more of the rack PDUs, the loss of power is reported to an operator of the remote facility.

According to one embodiment, a method of maintaining capacity at a computing facility includes operating, at a computing facility, computing systems for multiple computing service customers. In response to the notification from the customer, power is restored for the rack PDU in the computing systems.

As used herein, "computer room" means a room of a building in which computer systems, such as rack-mounted servers, are operated.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "co-location" includes a facility in which computing systems for one or more customers are located in which networking, operation, and/or maintenance of the computing systems is at least partially outside the customer's control. A co-location facility for multiple customers may be controlled by a co-location operator. In some embodiments, a co-location operator provides facilities, networking services, and maintenance services for co-location customers.

As used herein, "operating power" means power that can be used by one or more computer system components. Operating power may be stepped down in a power distribution unit or in elements downstream from the power distribution units. For example, a server power supply may step down operating power voltages (and rectify alternating current to direct current).

As used herein, a "cable" includes any cable, conduit, or line that carries one or more conductors and that is flexible over at least a portion of its length. A cable may include a connector portion, such as a plug, at one or more of its ends.

As used herein, "power distribution unit" means any device, module, component, or combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.). A power distribution unit may include a transformer, power monitoring, fault detection, and isolation.

As used herein, "floor power distribution unit" refers to a power distribution unit that can distribute electrical power to various components in a computer room. A power distribution unit may be housed in an enclosure, such as a cabinet.

As used herein, "rack power distribution unit" refers to a power distribution unit that can be used to distribute electrical power to various components in a rack. A rack power distribution may include various components and elements, including wiring, bus bars, connectors, and circuit breakers. In some embodiments, a rack power distribution unit may distribute power to only some of the electrical systems in a rack. In some embodiments, a single rack includes two or more rack power distribution units that distribute power to different sets of electrical systems in the rack. For example, one rack may include a left rack power distribution unit that distributes power to half of the servers in the rack, and a right rack power distribution unit that distributes power to the other half of the servers in the rack.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "PDU coupling device" means any device that couples a power distribution unit with one or more other elements. In some embodiments, a PDU coupling device includes one or more cables. In some embodiments, a PDU coupling device includes a wireless transmitter/receiver combination.

As used herein, "primary power" means any power that can be supplied to an electrical load, for example, during normal operating conditions.

As used herein, "reserve power" means power that can be supplied to an electrical load upon the failure of, or as a substitute for, primary power to the load.

As used herein, "source power" includes power from any source, including but not limited to power received from a utility feed. In certain embodiments, "source power" may be received from the output of a transformer.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc—read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

In various embodiments, a data center includes one or more rack PDU power monitors that are connected to output receptacles on rack PDUs in the data center. In some embodiments, one rack PDU power monitor is connected to receptacles in two or more rack PDUs. In some embodiments, one rack PDU power monitor connected to rack PDUs in two or more different racks.

FIG. 1 is a block diagram illustrating one embodiment of a data center including a rack PDU power monitor is connected to rack PDUs in two or more different racks. Data center 100 includes rack systems 102, primary power system 104, reserve power system 106, and PDU power monitor module 108. PDU power monitoring module 108 is coupled to external monitoring system 109 by way of network 110.

Rack systems 102 include electrical systems 111. Electrical systems 111 may include, for example, computer systems, rack-mounted servers, network control devices, power supply units, air moving devices, and mass storage devices.

Rack systems 102 may be located in a computing room. Electrical systems 111 may receive electrical power from primary power system 104 and reserve power system 106 by way of a feed to the computing room (for example, a sub-floor feed). Each of primary power system 104 and reserve power system 106 is coupled to automatic transfer switch 120.

Each of rack systems includes two rack power distribution units 126. Rack power distribution units 126 in rack systems 102 may receive power from primary power system 104 or reserve power system 106 by way of automatic transfer switch 120. Although two rack systems are shown in FIG. 1, in various embodiments a data center may have any number of rack systems. Moreover, in certain embodiments, a rack system may have only one rack power distribution unit, or more than two rack power distribution units.

Rack power distribution units 126 include rack PDU receptacles 130 and rack PDU receptacles 132. In one embodiment, rack PDU receptacles 130 are IEC 60320 C13 panel-mount receptacles and rack PDU receptacles 132 are IEC 60320 C19 panel-mount receptacles. In some embodiments, all of rack PDU receptacles 130 and rack PDU receptacles 132 are wired in parallel with one another. In other embodiments, rack PDU receptacles 130 and/or rack PDU receptacles 132 may be split in various ways into two or more banks of receptacles. The receptacles in each bank may be wired in parallel with one another. In some embodiments, one bank of receptacles is provided for each hot wire from the power source (one bank for A-neutral, another for B-neutral) or for each hot wire pairing from the power source (AB, BC, AC).

In operation of data center 100, any or all of rack PDU receptacles 130 and rack PDU receptacles 132 may be used to supply power to electrical systems in rack system 102, such as servers. Electrical systems 111 are coupled to rack power distribution unit 126 by way of cables 128. Cables 128 are coupled in various rack PDU receptacles 130 and/or rack PDU receptacles 132.

The rack PDU power may be any suitable voltage. In one embodiment, electrical power is about 208 V. In one embodiment, electrical power is about 230 V. In some embodiments, different electrical systems 111 connected to a rack PDU may operate on different phases of primary power system 104. For example, in rack PDU 126 shown in FIG. 1, electrical power is provided on legs 134 and 136. Each of legs 134 and 136 may correspond to one phase of the input power. In one embodiment, each leg operates at a voltage between about 220 volts to about 260 volts.

In an embodiment, an automatic transfer switch includes a dual input including a primary and secondary input each at 200-240VAC 24 A, single phase, 50/60 Hz, and an output at 200-240VAC 24 A, single phase, 50/60 Hz. Autoswitching between the primary input and the secondary input may be based on drop-out of 182 volts, pull-in of 195 volts, based on an input voltage of 208 V.

Legs 134 and 136 of rack power distribution unit 126 include wiring to PDU receptacles 130 and PDU receptacles 132. Many receptacles may be provided for each of legs 134 and 136. Each of legs 134 and 136 may include breaker 138. In one embodiment, breaker 138 is a 30 A/32 A single pole MCB. Breakers 134 may be located such that they can be accessed when server racks are in-line (e.g., at the top of rack power distribution unit 126). In one embodiment, power is provided to rack PDU 126 by way of an 8 AWG/6 mm$^2$ 5 core cable and a 30 A NEMA/32 A IEC309 3Ph+N+E Plug. The cable may be located, for example, on the bottom of rack PDU 126. Although two legs are shown in FIG. 1 for illustrative purposes, a rack PDU may receive input power on any number of phases, including single-phase or three-phase power.

Primary power system 104 and reserve power system 106 may include one or more of various other components and sub-systems, such as transformers, generators, switchgear, and floor power distribution units. In some embodiments, primary power system 104 and reserve power system 106 each include an uninterruptible power supply ("UPS"). In some embodiments, primary power system 104 and reserve power system 106 each include a floor power distribution unit.

In some embodiments, a transformer for each of the power systems is coupled to a utility feed. The utility feed may be a medium voltage feed. In certain embodiments, the utility feed is at a voltage of about 13.5 kilovolts or 12.8 kilovolts at a frequency of about 60 Hz. Generators may provide power to primary power system 104 in the event of a failure of utility power to the transformer. In one embodiment, one generator provides back-up power for each of two or more primary power systems. The UPS may provide uninterrupted power to rack-mounted electrical systems in the event of a power failure upstream from the UPS. In certain embodiments, a UPS receives three-phase power from a transformer. The UPS may supply three-phase power to a floor power distribution unit.

PDU power monitor module 108 is coupled to rack PDUs 126 in rack systems 102 by way of lines 140. Lines 140 may serve as coupling devices connecting rack PDUs 126 to PDU power monitor module 108. PDU power monitor module 108 is coupled to network 110 by way of lines 142. Lines 140 and lines 142 may each be, in various embodiments, a cable, an electrical bus, or a combination thereof. In certain embodiments, lines 140 include a wireless connection between PDU power monitor module 108 and the coupled element. In certain embodiments, line 142 includes a wireless connection between power monitor module 108 and network 110.

Although in the embodiment shown in FIG. 1, PDU power monitor module 108 is located outside of rack systems 102, in various embodiments a PDU power monitoring module may be located in a rack. In certain embodiments, a PDU power monitor module for PDUs in several racks is rack-mounted in one of the racks. For example, a PDU power monitor module may be rack-mounted in Rack System 1.

In certain embodiments, a PDU power monitor is coupled to all of the rack PDUs in a data center. In other embodiments, a PDU power monitor may monitor only some of the rack PDUs in the data center. In one embodiment, a PDU power monitor is provided for each row of racks in a data center.

PDU power monitor module 108 includes power module 144, control module 146, and network interface module 148. Control module 146 may include control circuits for monitoring and reporting on rack PDUs 126. In some embodiments, control module 146 includes a microprocessor that implements program instructions for monitoring and reporting on rack PDUs 126. In some embodiments, some or all of the components of the power monitor module are contained in an enclosure. The enclosure may be mounted inside the rack, on the rack, or at another location.

In some embodiments, control module 146 includes data storage elements. For example, control module 146 may include data storage elements for storing addresses for various of rack PDUs 126. In some embodiments, an address may be stored in association with a physical location within a data center (for example, Row 6, Rack 4, left-side rack PDU.)

Network interface module 148 may exchange data and signals between control module 146 and external system 109 over network 110. In one embodiment, network interface module 148 is an Ethernet card. In another embodiment, network interface module 148 provides for a fiber optic transmission of data. In some embodiments, each of rack PDUs 126 is assigned an address, which is stored in memory in control module 146. If voltage is lost in one or more of the legs of a particular one of rack PDUs 126 (for example, one of overload protection devices 138 trips), control module 144 may sense that a fault has occurred in the rack PDU 126 and send a fault message to external system 109 over network 110. The message may include the appropriate address to identify the failed PDU.

Power module 144 may supply power to control module 146 and network interface module 148. In some embodiments, power module 144 may draw power for operating PDU power monitor module 108 from one or more of the rack PDUs 126 that are being monitored. In one embodiment, power module 144 receives power from one or more of rack PDUs 126 by way of lines 140 and converts the power to suitable outputs for control module 146 and network interface module 148. Thus, in cases where power monitor module 108 is coupled to two or more rack PDUs 126, power monitor module 108 will continue to have power to operate as long as even one of the rack PDUs 126 continues to supply power to the power monitor module.

Power module 144 includes backup power device 150. Backup power device 150 may serve as backup power for power monitor module 108. Backup power device 150 may be any device that can at least temporarily supply power to power monitor module 108 in the event of a power loss from all external sources (for example, if all rack PDUs 126 to which PDU power monitor module 108 is connected to have failed). Backup power device 150 may be, for example, a battery or a backup power capacitor.

In some embodiments, each of power module 144, control module 146, and network interface module 148 is a separate circuit board assembly. In other embodiments, two or more of power module 144, control module 146, and network interface module 148 are combined on a single circuit board assembly. For example, power, control, and network interface circuitry may be combined on a single circuit board assembly.

In some embodiments, messages are sent from PDU power monitor module 108 using Simple Network Management Protocol (SNMP) data (for example, an SNMP trap). Any network protocol, however, may be used in various embodiments to send data from, or receive data into, PDU power monitor module 108.

In some embodiments, a power monitor module may control an alarm at the location of the rack PDUs. For example, an audible alarm (such as a buzzer or siren) or visual alarm (flashing light) for each rack or each rack PDU may be provided at or near the rack or PDU. Upon failure of the rack PDU, the power monitor module may trigger the alarm.

Figure 2:
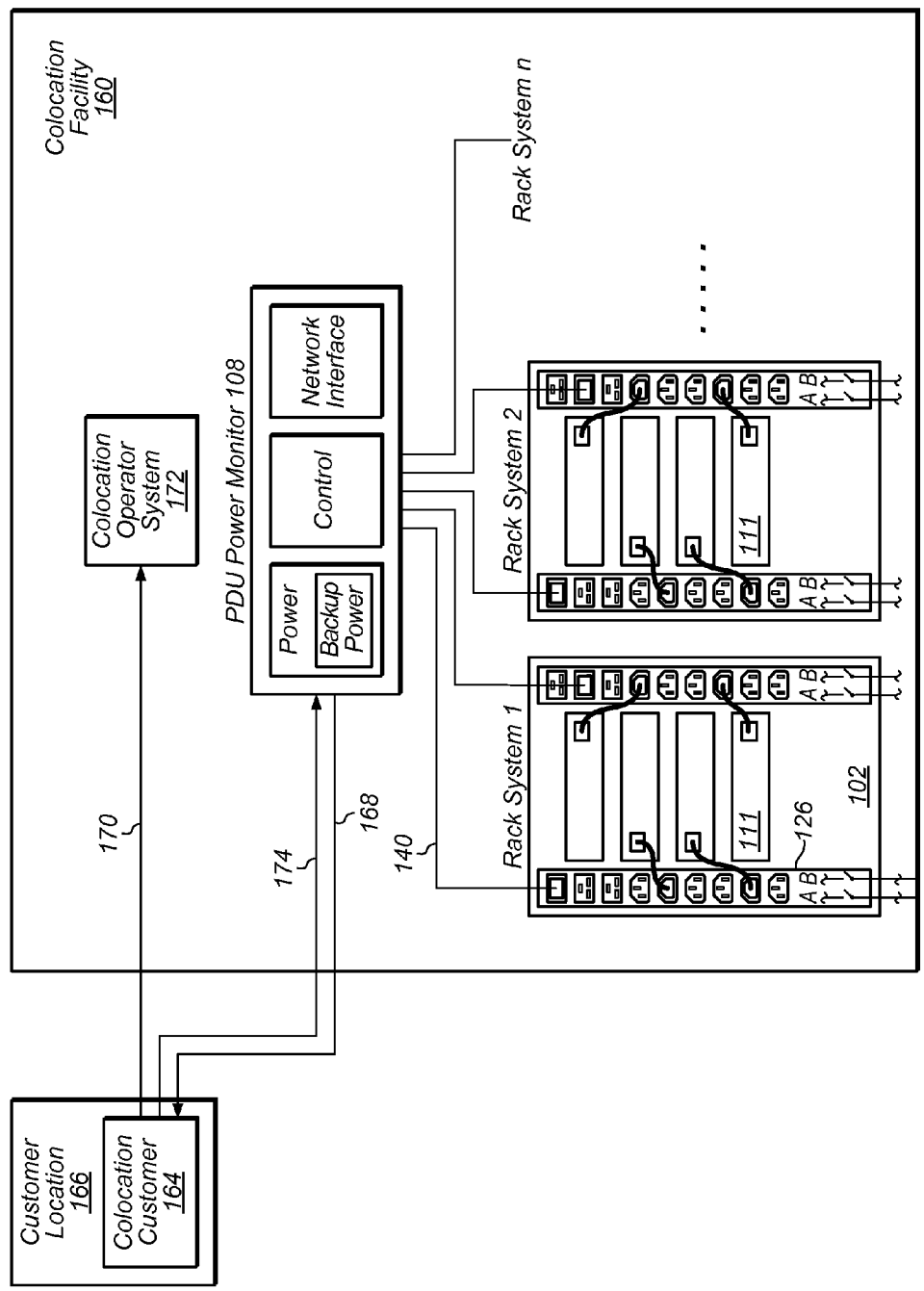
FIG. 2 illustrates one embodiment of a power monitor module that can report rack PDU failures to a customer outside of a co-location facility.

In some embodiments, a power monitor coupled to rack power distribution units in a data center reports failure of a rack power distribution unit to a location outside of the data center. FIG. 2 illustrates one embodiment of a power monitor module that can report rack PDU failures to a customer outside of a co-location facility. Co-location facility 160 includes rack systems 102. Rack systems 102 may be similar to those described above relative to FIG. 1. In some embodiments, at least some of rack systems 102 are provided to the co-location facility by a co-location customer.

PDU power monitor module 108 may be connected to each of the rack PDUs in co-location facility 160 that provide power for computing systems 111 that are used (either directly or indirectly) by the co-location customer. For example, if the co-location customer uses servers in Rack System 1 and Rack System 6, the rack PDUs in Rack System 1 and Rack System 6 may be coupled to PDU power monitor module 108. Each of rack PDUs 126 relied on by the co-location customer (and/or the individual legs of the rack PDU) may be assigned an address (for example, rack1_leftPDU, rack1_rightPDU, rack6_leftPDU_legA, rack6_leftPDU_legB, etc.). The address may be stored on PDU power monitor module 108 in association with the lines connecting PDU power monitor module 108 to the rack PDU.

PDU power monitor module 108 may be enabled to send messages to, and receive messages from, co-location customer system 164 at co-location customer location 166. In the event of a failure of one of rack PDUs 126, fault message 168 (for example, an SNMP trap) may be sent from PDU power monitor module 108 to co-location customer system 164. Upon receipt of fault message 168, co-location customer may take action to correct the fault. For example, using co-location customer system 164, the co-location customer may send message 170 to co-location operator system 172 that rack PDU has shut down, thus notifying the co-location operator that corrective action is required on that rack PDU. In some embodiments, the co-location customer may send control message back to PDU power monitor module 108. For example, message 174 may be sent from co-location customer system 164 directing PDU power monitor module 108 to sound an alarm at the location of the failed rack PDU.

Figure 3:
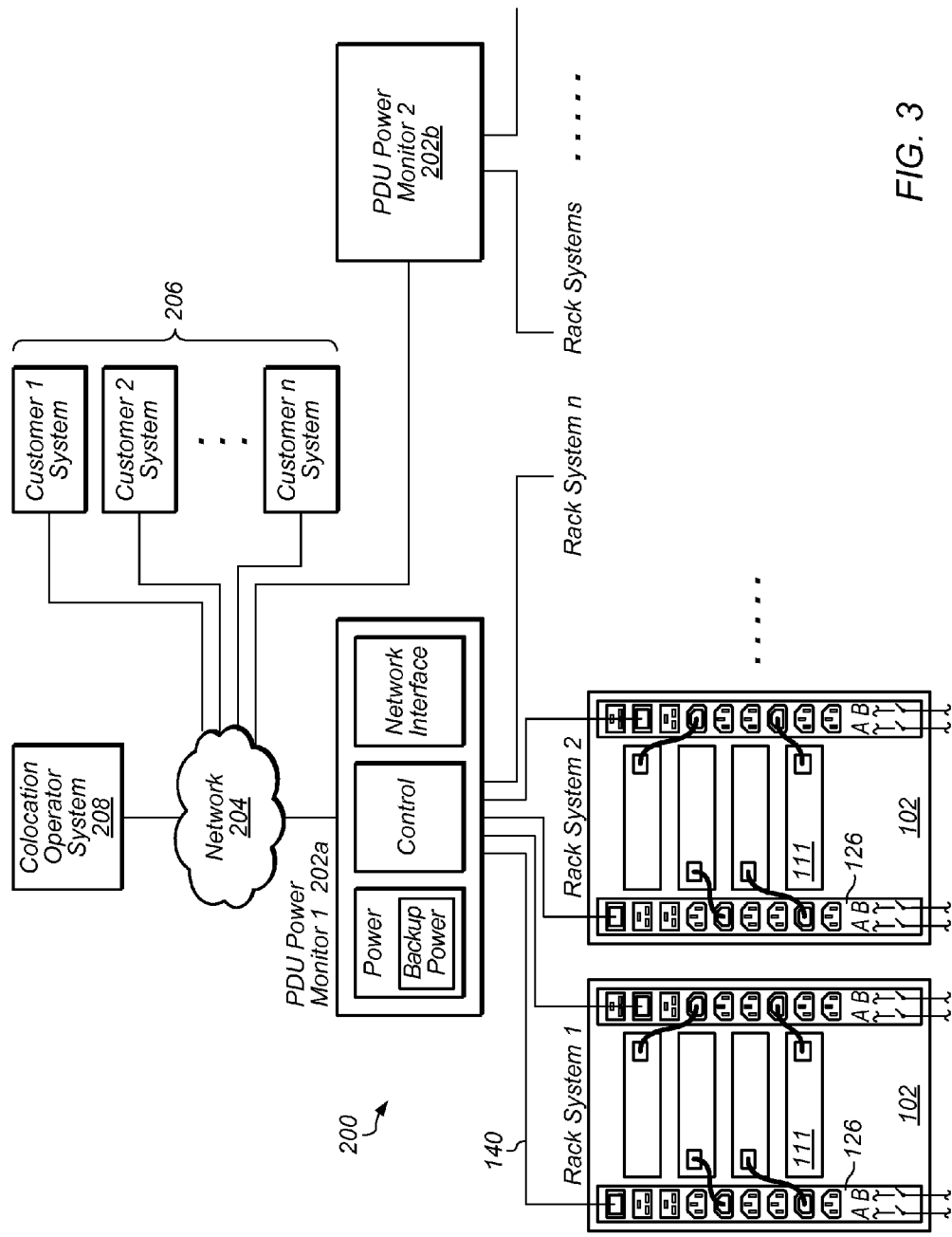
FIG. 3 illustrates one embodiment of a data center having PDU power monitors that report to co-location customers over a network.

In some embodiments, PDU power monitors at a co-location facility report over a network to one or more customers of the facility. The network may be, for example, the Internet. FIG. 3 illustrates one embodiment of a data center having PDU power monitors that report to co-location customers over a network. Co-location facility 200 includes rack systems 102 and PDU power monitors 202a and 202b. Rack systems 102 may be similar to those described above relative to FIG. 1. Each of PDU power monitors 202a and 202b may be coupled to rack PDUs 126 in different rack systems at co-location facility 200. In one embodiment, PDU power monitor 202a monitors and reports on rack PDUs for one of the customers, and PDU power monitor 202b monitors and reports on rack PDUs for another of the customers.

In certain embodiments, one PDU power monitor provides monitoring and reporting for two or more different customers. Each rack PDU may be assigned an address for use in directing fault messages to the appropriate customer.

Each of PDU power monitors 202a and 202b includes a connection with network 204. PDU power monitors 202a and 202b may exchange data with each of customer systems 206 and with co-location operator system 208. For example, PDU power monitor 202a may report to Customer 1 that one of rack PDUs 126 in Rack System 1 is no longer supplying power to electrical systems 111 in Rack System 1. In certain embodiments, a PDU power monitor may report PDU faults directly to a co-location operator.

Co-location operator system 208 may exchange data with each of co-location customer systems 206 over network 204. For example, each of co-location customer systems 206 may notify co-location operation system 208 if a rack PDU supplying power to one of that customer's computing systems has shut down.

Figure 4:
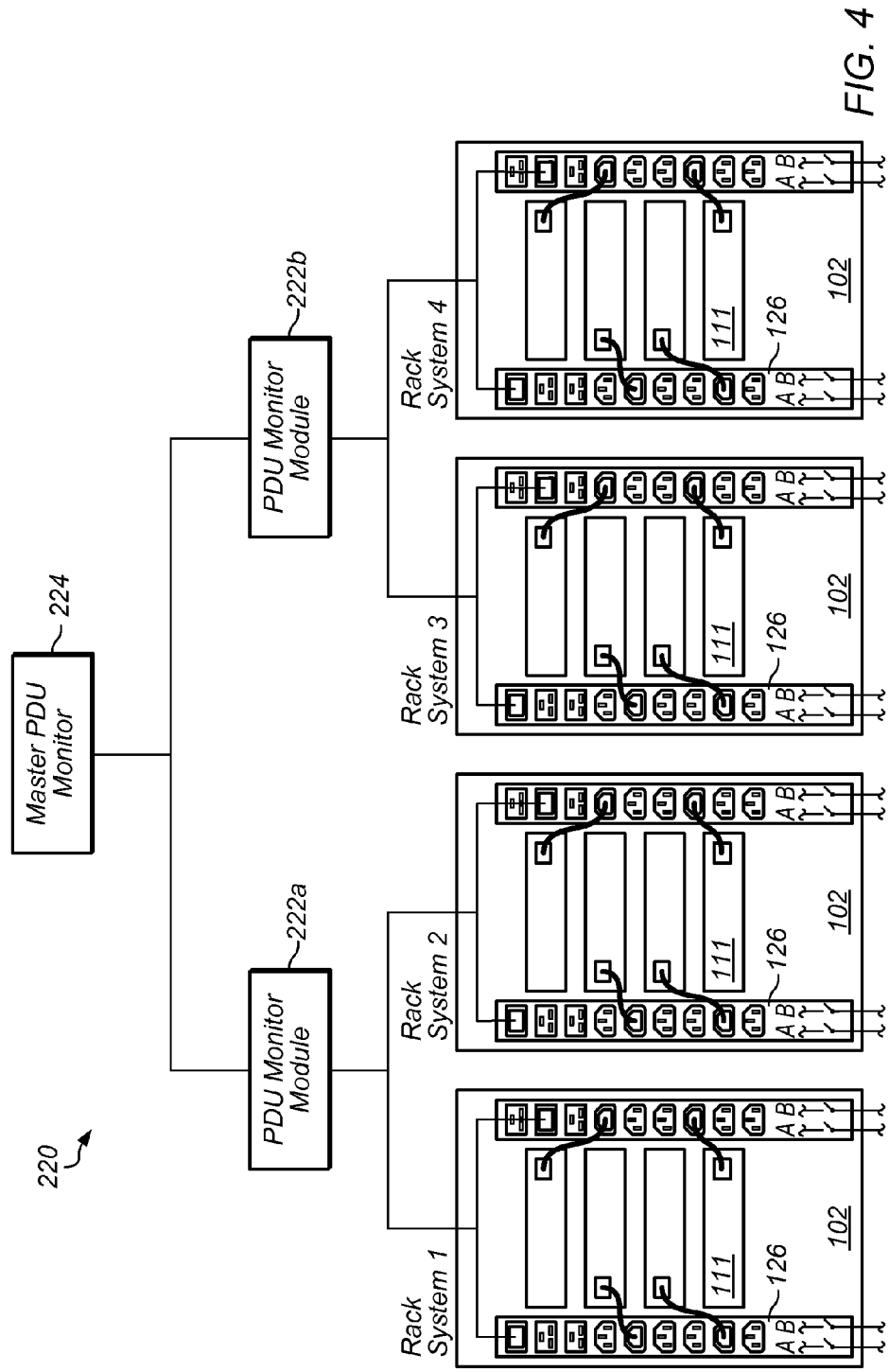
FIG. 4 illustrates one embodiment of a data center include PDU monitors that report to a master power monitor.

In some embodiments, multiple PDU power monitors may report to, or exchange data with, a master power monitor. FIG. 4 illustrates one embodiment of a data center include PDU monitors that report to a master power monitor. Data center 220 includes rack systems 102, PDU monitor module 222a, PDU monitor module 222b, and master power monitor 224. PDU monitor module 222a and PDU monitor module 222b may each monitor power a different set of rack systems 102. PDU monitor module 222a and PDU monitor module 222b may report to master power monitor 224.

Figure 5:
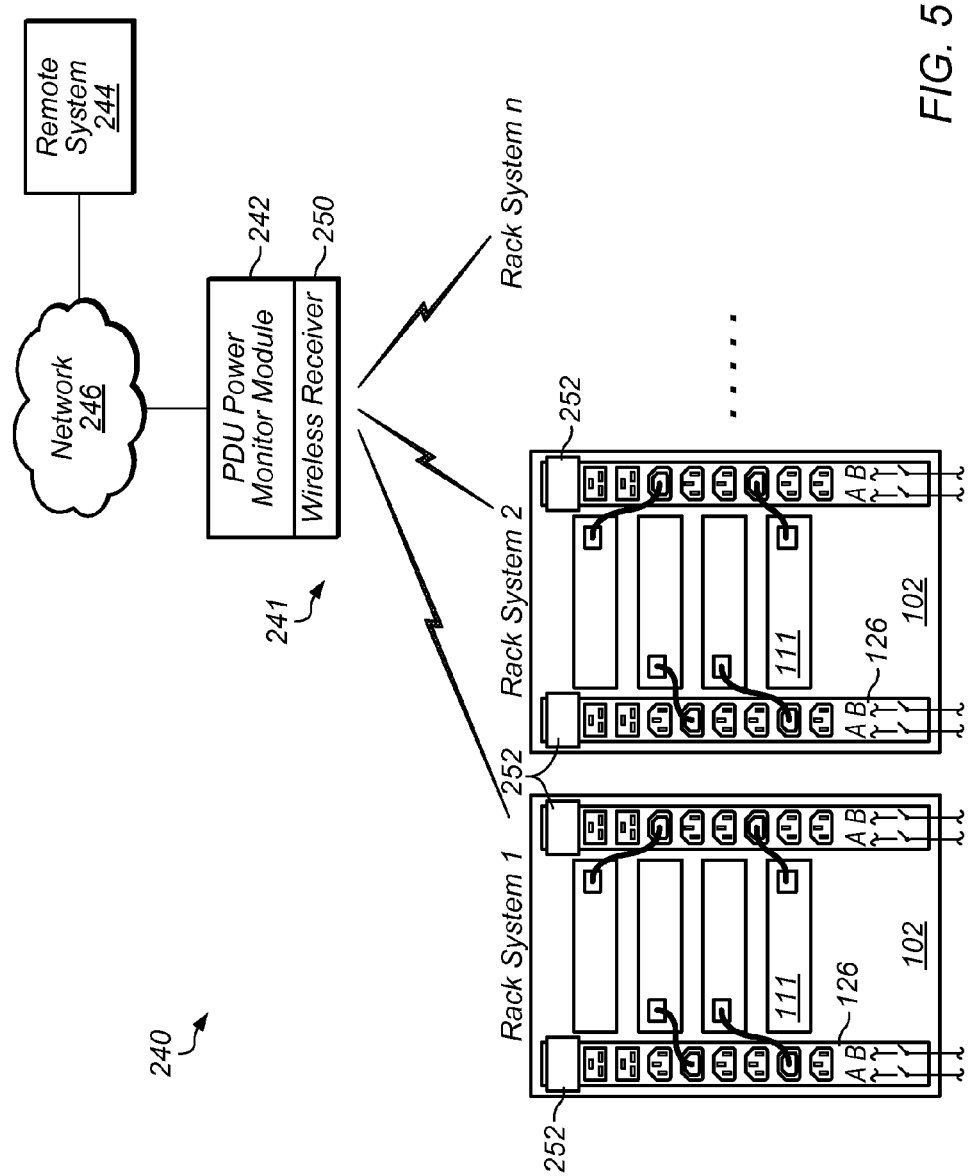
FIG. 5 illustrates one embodiment of a data center with a PDU power monitor that receives data from rack PDUs over a wireless connection.

In certain embodiments, a PDU power monitor operates without any cabling into the rack systems being monitored. FIG. 5 illustrates one embodiment of a data center with a PDU power monitor that receives data from rack PDUs over a wireless connection. Data center 240 includes rack systems 102 and PDU power monitor 241. PDU power monitor 241 includes PDU power monitor module 242 and wireless transmitters 252. PDU power monitor module 242 includes PDU wireless receiver 250. Wireless transmitters 252 may be plugged into an outlet in each of the rack PDUs 126 to be monitored. Wireless transmitters 252 may send data to wireless receiver 250 on PDU power monitor module 242. Each wireless transmitter 252 may report power status for the rack PDU 126 in which it is connected. In some embodiments, PDU power monitor module 242 is located outside of any of the racks being monitored (for example, on the ceiling of a room of the data center). In other embodiments, PDU power monitor module 242 is located in one of the racks. In certain embodiments, one PDU wireless receiver covers a subset of the rack PDUs in a data center (for example, all the rack PDUs in a particular row of racks.

In some embodiments, a method of using a PDU power monitor includes reporting to a system external the monitor (for example, a remote computer system). For example, a message may be sent over a network to a remote computer that power has been lost in a particular rack PDU supplying power in a data center.

Figure 6:
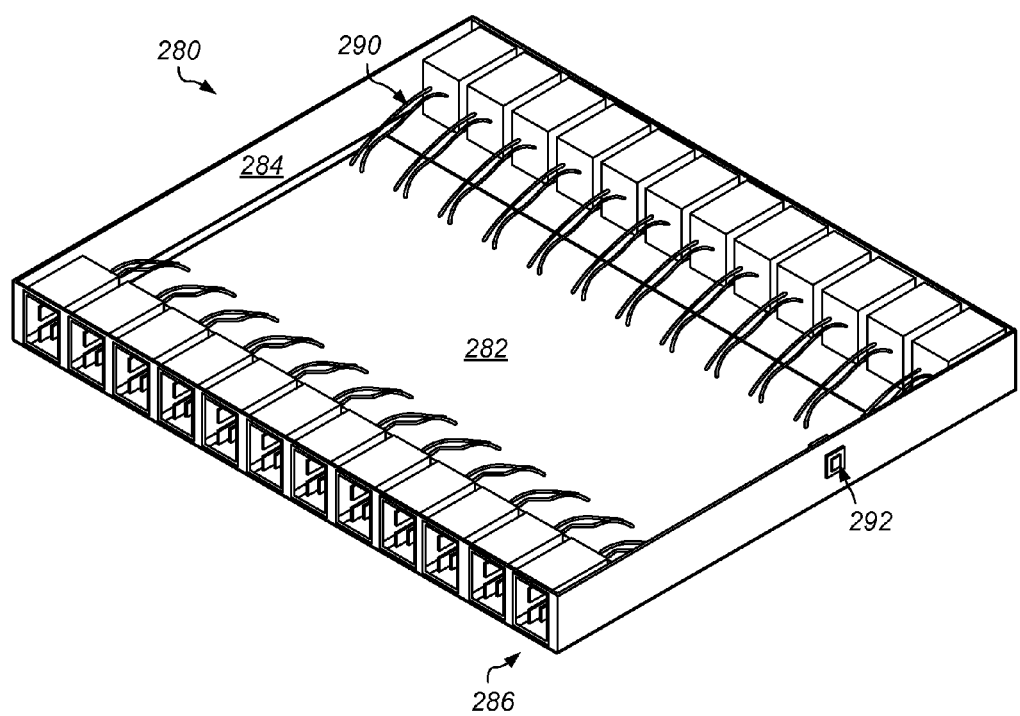
FIG. 6 illustrates one embodiment of a power monitoring device.

FIG. 6 illustrates one embodiment of a power monitoring device. Power monitoring device 280 includes circuit board assembly 282, enclosure 284, and receptacles 286. Enclosure 284 may include a top cover (not shown in FIG. 6 for illustrative purposes). Rows of receptacles 286 may be provided on the front and back of enclosure 284. Each of receptacles 286 may be connected to circuit board assembly 282 by way of wires 290. In some embodiments, each of receptacles 286 is a IEC320-C19 panel mount receptacle.

Circuit board assembly 282 may include circuits for monitoring power from one or more rack PDUs coupled to power monitoring device 280 by way of receptacles 286. In some embodiments, circuit board assembly 282 provides network interface circuitry for sending data to, and receiving data from, an external system. Circuit board assembly 282 may exchange data with an external system by way of I/O jack 292. In one embodiment, circuit board assembly 282 is connected to a network by way of a Cat 5 cable installed in I/O jack 292.

In some embodiments, power monitoring device 280 is rack-mountable. In one embodiment, enclosure 284 includes rack ears to allow power monitoring device 280 to be installed in a rack. In one embodiment, power monitoring device 280 mounts in a 1U slot in a 19 inch standard rack. Power monitoring device 280 may, however, be any shape and size. In certain embodiments, a power monitoring device has a "zero U" form factor that allows installation in a rack such that the monitor does not consume any of the slots in the rack.

In certain embodiments, power monitoring device 280 includes lamps or other indicators that provide a visual indication of circuit board functions (such as power on or data connection), or an indication of power in one or more of the PDU racks being monitored.

Figure 7:
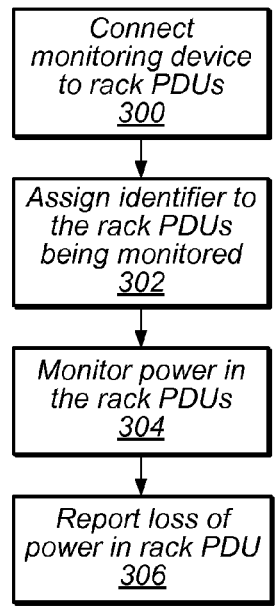
FIG. 7 illustrates one embodiment of monitoring electrical power that includes reporting a loss of power in a rack PDU.

FIG. 7 illustrates one embodiment of monitoring electrical power that includes reporting a loss of power in a rack PDU. At 300, a monitoring device is connected to rack PDUs. The rack PDUs may be, for example, supplying power to servers in a data center. At 302, an identifier is assigned to each of the rack PDUs being monitored.

At 304, power is monitored in the rack PDUs as the rack PDUs supply power to electrical systems. At 306, upon the occurrence of a loss of power in one of the rack PDUs, the loss of power in the rack PDU is reported. In some embodiments, a report is in the form of a message sent over a network. The report may include the identifier for the rack PDU.

Upon reporting of the loss of power to rack PDU, corrective action may be taken to restore power for the PDU. For example, a breaker may be reset on the rack PDU. In some embodiments, a power monitor may send a message that power has been restored.

In some embodiments, a power monitor sends out a periodic status message for the rack PDUs being monitored. For example, the power monitor may send a message that all of the rack PDUs being monitored are supplying power.

In some embodiments, a remote system may manage one or more PDU power monitors. In certain embodiments, a remote system may query PDU power monitors, for example, by way of a message over a network. In some embodiments, trend analysis for rack PDUs may be carried out using data from one or more power monitors, either on a PDU power monitor or on a remote system receiving data from the monitors.

In various embodiments, rack PDUs are monitored from a remote location. In one embodiment, rack PDUs are remotely monitored by a customer of computing services carried out for the benefit of the customer at a co-location facility. A loss of power in any of the rack PDUs may be reported to the operator of the facility, who can take correction action to restore power to the rack PDUs.

Figure 8:
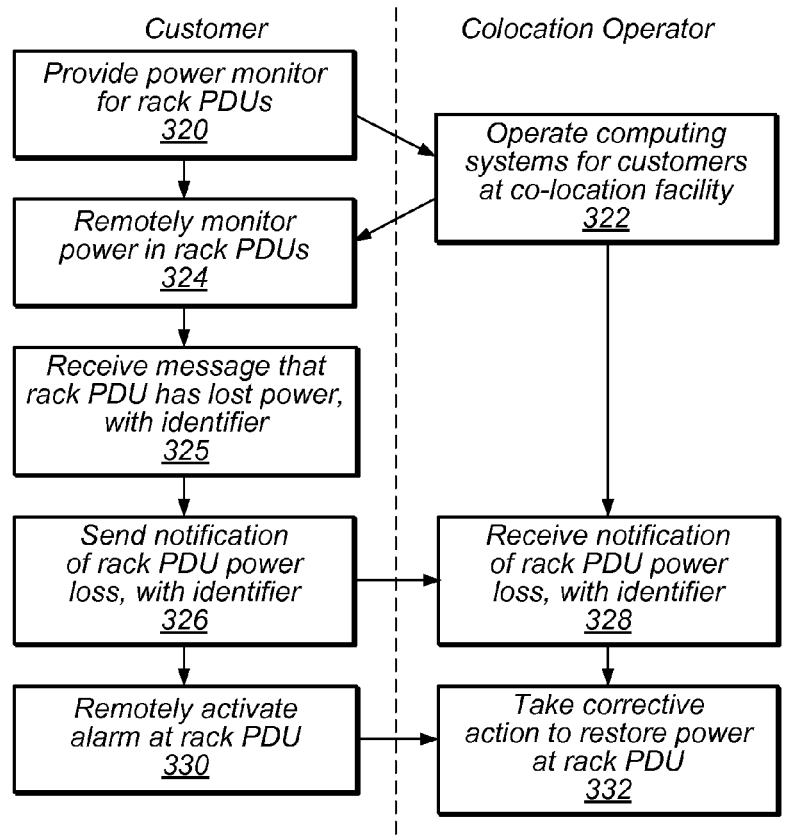
FIG. 8 illustrates operation of a co-location facility with remote monitoring of rack PDUs by a customer of the facility.

FIG. 8 illustrates operation of a co-location facility with remote monitoring of rack PDUs by a customer of the facility. At 320, power monitors are provided for rack PDUs to be operated at the facility. The power monitors may be, for example, in or with rack systems supplied to the co-location facility by the customer, or by a third party computing system supplier at the direction of the customer. At 322, the co-location operator operates computing systems for customers at the co-location facility. Rack PDUs that supply power to computing systems operated for the customer may be monitored with a PDU power monitor.

At 324, power in the rack PDUs is remotely monitored by the customer. At 325, the customer receives a message that power has been lost in one of the rack PDUs at the co-location facility. The message may include an identifier that specifies the particular rack PDU that has lost power. Upon receipt of the message, the customer sends notification to the operator of the loss of power to the rack PDU at 326. In some embodiments, the message is sent automatically from a remote computer system controlled by the customer. In other embodiments, the message from the customer to the co-location operator involves personal communication (for example, a phone call to maintenance personnel at the co-location). At 328, the notification from the customer is received by the co-location operator.

At 330, an alarm may be remotely activated at the rack PDU that has lost power. The alarm may include a visual alarm, and audible alarm, or both. In certain embodiments, an alarm may be activated automatically by the power monitor upon the loss of power to the rack PDU. In some embodiments, the alarm may be activated only by an action by the customer (for example, triggering the alarm with a command at the customer's remote system).

At 332, correction action is taken to restore power at the rack PDU. The corrective action may be taken in response to the message from the customer, from the alarm activated by the PDU power monitor, or both.

Although in some embodiments described, a rack PDU is monitored as a unit, in some embodiments, each leg of a rack PDU (for example, phase A and phase B) may be monitored separately.

Although in some embodiments described above, a monitor is connected by way of an IEC power connector, a monitor may be connected to by way of any type of connector. For example, a monitor may be connected by way of a NEMA L6-30 or NEMA L7-30R connector.

Although in some embodiments described above, monitoring and reporting is carried out on a rack PDU, monitoring and reporting may in various embodiments be performed for any element in a power chain. For example, a power monitor may be provided for a floor PDU, a remote power panel, or an uninterruptable power supply, or an automatic transfer switch.

In various embodiments described above, the PDU power monitors have been described as monitoring and reporting loss of power from a rack PDU (for example, tripped breaker causing loss of voltage on one of the conductors in a PDU receptacle. Nevertheless, a PDU power monitor may in various embodiments monitor, report, or track any characteristic of power in a rack PDU, the systems that receive power from the rack PDU, or the systems that receive power from the rack PDU. In one embodiment, a PDU power monitor records load or current history for electrical systems coupled to the rack PDU.

In some embodiments, a PDU monitor may perform, or provide data for, statistics or trend analysis one or more rack PDUs. For example, a PDU power monitor may determine a percentage of time a rack PDU or set of rack PDUs has been down during a particular period of time.

In various embodiments described above, power distribution monitoring is carried out for computing systems (for example, servers) in a data center. Nevertheless, monitoring may be carried out for power distribution to any type of electrical system. Examples include hospital equipment, utility systems, security systems, military systems, telecommunications systems, or electronic commerce systems. In certain embodiments, power distribution monitoring is carried out for a critical system, such as a life support system.

Although in the embodiments shown above, a PDU power monitor is coupled to outlets in a rack PDU, a PDU power monitor may in various embodiments be connected to a PDU in any manner. For example, a PDU monitor may have a dedicated monitor connector port.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
one or more racks;
one or more electrical systems mounted in at least one of the racks;
one or more rack power distribution units (PDUs) in at least one of the racks, wherein at least one of the rack PDUs is configured to distribute electrical power to at least part of the electrical systems in at least one of the racks;
one or more rack PDU power monitors configured to externally couple to at least one of the rack PDUs and to monitor electrical power from at least one of the rack PDUs, wherein at least one of the rack PDU power monitors comprises:
one or more PDU coupling devices configured to be coupled with one or more PDU output receptacles of one or more of the rack PDUs on a downstream side of the one or more PDU output receptacles; and
a monitoring device coupled to the one or more PDU coupling devices, such that the monitoring device is externally coupled to the at least one of the rack PDUs, wherein the monitoring device is configured to monitor electrical power output from at least one of the PDU output receptacles.

2. The data center of claim 1, wherein the one or more rack power distribution units (PDUs) comprise two or more rack PDUs in a first one of the racks, wherein at least one of the rack PDU power monitors is configured to monitor electrical power from at least two of the rack PDUs in the first one of the racks.

3. The data center of claim 1, wherein at least one of the rack PDU power monitors is configured to associate an address with at least one of the rack PDUs coupled to the rack PDU power monitor.

4. The data center of claim 1, wherein the one or more PDU coupling devices for at least a first one of the rack PDU power monitors are coupled with rack PDUs in two or more different racks in the data center.

5. The data center of claim 1, wherein the monitoring device for at least one of the rack PDU power monitors is configured to report status for at least one of the rack PDUs to a system external to the rack PDU power monitor.

6. The data center of claim 1, wherein the one or more rack PDU power monitors comprise two or more rack PDU power monitors, wherein each of at least two of the rack PDU power monitors are coupled to rack PDUs in different racks, wherein at least two of the rack PDU monitoring devices report to a common master monitor.

7. A system for monitoring electrical power from rack power distribution units (PDUs), comprising:
one or more PDU coupling devices configured to couple with one or more PDU output receptacles of one or more rack PDUs on a downstream side of the one or more PDU output receptacles, wherein each of at least one of the rack PDUs is configured to distribute electrical power to at least part of the electrical systems in at least one rack; and
a monitoring device coupled to the one or more PDU coupling devices, wherein the monitoring device is configurable to monitor electrical power output from at least one of the PDU output receptacles.

8. The system of claim 7, wherein the one or more PDU coupling devices are configured to couple with rack PDUs in two or more different racks.

9. The system of claim 7, wherein the monitoring device is configured to mount in at least one of the racks.

10. The system of claim 7, wherein at least one of the PDU coupling devices is configured to couple to two or more hot lines of power from the rack PDU, wherein the power monitor is configured to detect a fault in the electrical power in either of the two hot lines.

11. The system of claim 7, wherein at least one of the PDU coupling devices comprises one or more cables configured to couple the output receptacle on at least one of the rack PDUs to the monitoring device.

12. The system of claim 7, wherein at least one of the PDU coupling devices comprises a wireless transmitter coupled to the PDU output receptacle and a wireless receiver coupled to the monitoring device, wherein the wireless transmitter is configured to transmit a power status signal or message to the wireless receiver indicating whether the rack PDU has power.

13. The system of claim 7, wherein the monitoring device comprises an addressing module configured to associate an address with one or more of the rack PDUs coupled to the monitoring device.

14. The system of claim 7, wherein the monitoring device for at least one of the rack PDU power monitors is configured to report status for at least one of the rack PDUs to a system external to the rack PDU power monitor.

15. The system of claim 14, wherein the monitoring device is configured to report to a computer system over a network.

16. The system of claim 7, wherein the monitoring device is configured to periodically report that each of one or more of the rack PDUs is supplying electrical power.

17. The system of claim 7, wherein the monitoring device receives at least a portion of its operating power from one of the rack PDUs through at least one of the PDU coupling devices.

18. The system of claim 7, wherein the monitoring device comprises a backup power device configured to supply operating power to the monitoring device.

19. The system of claim 7, wherein the monitoring device is configurable to monitor at least one characteristic of power quality from at least one of the PDU output receptacles.

20. The system of claim 7, wherein the monitoring device is configurable to monitor and report load or current history for at least one of the rack PDUs.

21. A method of monitoring electrical power in a data center, comprising:
    connecting a monitoring device to two or more rack PDUs, wherein each of at least one of the rack PDUs is configured to distribute electrical power to at least part of the electrical systems in at least one rack;
    monitoring power in at least two of the two or more of the rack PDUs; and
    upon occurrence of a loss of power in one of the rack PDUs, reporting the loss of power in the rack PDU to a system external to the monitor.

22. The method of claim 21, further comprising assigning an identifier to at least one of the rack PDUs being monitored, wherein reporting the loss of power comprises sending the identifier to the system external to the monitor.

23. The method of claim 21, wherein reporting the loss of power comprises sending a failure indicator message over a network to the system external to the monitor.

24. The method of claim 21, further comprising performing service on the rack PDU to restore power from the rack PDU.

25. A method of monitoring computing capacity at a remote computing facility, comprising:
    remotely monitoring, over a network, electrical power output from one or more rack PDUs supplying electrical power to computing systems being operated at a remote facility, wherein each of at least one of the rack PDUs is configured to distribute electrical power to at least part of the electrical systems in at least one rack;
    wherein remotely monitoring comprises receiving data from a PDU power monitor externally coupled to at least one outlet receptacle of a rack PDU at the remote facility; and
    reporting to an operator of the remote facility, upon the occurrence of a loss of power in one or more of the rack PDUs, that the loss of power has occurred.

26. The method of claim 25, wherein remotely monitoring the electrical power output from one or more rack power distribution units comprises receiving a power lost indicator from a PDU power monitor coupled to two or more racks at the remote facility.

27. The method of claim 25, wherein the remote facility is a co-location computing facility, wherein the operator of the co-location computing facility provides computing services to at least two computing service customers at the co-location computing facility.

28. A method of maintaining capacity at a computing facility, comprising:
    operating, at a computing facility, computing systems for two or more computing service customers;
    receiving a notification from one of the customers that power has been lost in one or more rack PDUs that were supplying power to one or more of the computing systems; and
    restoring power for at least one rack PDU in response to the notification from the customer.

29. The method of claim 28, wherein the notification is received from a computing service customer remotely monitoring rack PDUs in the computing facility.

* * * * *